US006239345B1

(12) United States Patent
Laroche

(10) Patent No.: US 6,239,345 B1
(45) Date of Patent: May 29, 2001

(54) OPTIMAL LOOPING FOR WAVETABLE SYNTHESIS

(75) Inventor: Jean Laroche, Santa Cruz, CA (US)

(73) Assignee: Creative Technology Ltd., Singapore (SG)

( * ) Notice: Subject to any disclaimer, the term of this patent is extended or adjusted under 35 U.S.C. 154(b) by 0 days.

(21) Appl. No.: 09/546,493

(22) Filed: Apr. 10, 2000

Related U.S. Application Data

(63) Continuation of application No. 09/393,442, filed on Sep. 8, 1999, now Pat. No. 6,084,170.

(51) Int. Cl.[7] ................................ G01H 7/00; G11C 7/00
(52) U.S. Cl. ................................ 84/604; 84/607
(58) Field of Search ................................ 84/604, 607

(56) References Cited

U.S. PATENT DOCUMENTS 5,194,681 * 3/1993 Kudo ................................ 84/607 X
5,446,882 * 8/1995 Lee ................................ 84/607 X
5,637,821 * 6/1997 Izumisawa et al. ................................ 84/604

* cited by examiner

*Primary Examiner*—Jeffrey Donels
(74) *Attorney, Agent, or Firm*—Townsend and Townsend and Crew LLP

(57) ABSTRACT

In accordance with the present invention, a method and apparatus are provided wherein loop discontinuities are eliminated. In the case of amplitude discontinuities, the harmonic amplitudes contained in the loop are progressively scaled over the duration of the loop, so that for each harmonic the loop end amplitude matches the loop beginning amplitude. In the case of phase discontinuities, the harmonic phases are progressively shifted over the duration of the loop, so that for each harmonic the loop end phase matches the loop beginning phase. Shifting the phase is accomplished by slightly altering the frequency of the harmonics to produce the desired amount of phase-shift at the loop end. In accordance with the present invention, the method also provides a technique to select loop begin and end points to minimize the amount of phase adjustment.

10 Claims, 12 Drawing Sheets

OPTIMAL LOOPING FOR WAVETABLE SYNTHESIS

CROSS-REFERENCES TO RELATED APPLICATIONS

This application is a continuation application of Ser. No. 09/393,442 filed Sep. 08, 1999,now U.S. Pat. No. 6,084,170 the disclosure of which is incorporated herein in its entirety for all purposes.

FIELD OF THE INVENTION

This invention relates generally to the field of signal processing, and more particularly to a method and apparatus for looping signals from a wavetable to form synthesized signals.

BACKGROUND OF THE INVENTION

Wavetable sound synthesis refers to a process for synthesizing sounds from stored information. A wavetable is a table of data representing samples of sound information. Sounds may be synthesized by reading the samples from the wavetable into a digital to analog converter, thereby producing an analog sound signal representative of the desired sound. All types of sounds may be synthesized using this technique, however, large amounts of data storage are needed to store the individual sound samples. In a process known as looping, sounds are synthesized from a wavetable using fewer data samples. During the looping process, the desired sound signal can be created by repeatedly reading out a portion of a wavetable. This technique forms a continuous data stream that, when converted to analog form, will produce the desired sound signal. As a result of using the looping process, a wide range of sounds can be synthesized from a much smaller wavetable, thereby providing a more efficient way to synthesize sound signals.

Although the looping process improves wavetable efficiency, it can result in side effects detrimental to the quality of the synthesized sound. These side effects occur because the looping process produces artifacts as a result of mismatches, or discontinuities, in amplitude, phase or timbre between the beginning and end of the loop.

Techniques have been used in the past to overcome the problems associated with discontinuities in looped signals For example, one technique is called cross-fading. In a typical looping process, the end of one loop flows directly into the beginning of the next loop. At the meeting point there may exist severe discontinuities causing noticeable artifacts sometimes referred to as "clicks." In cross-fading, the loop end and loop beginning are overlapped. To compensate for the increased signal level at the overlapped portion, the end of the loop is faded out while the beginning of the loop is faded in. Although cross-fading can reduce the effects of discontinuities it does not eliminate them. These reduced, but still noticeable, artifacts are sometimes referred to as "blips."

Another technique used to compensate for the effects of looping is described in "Method and apparatus for producing an electronic representation of a musical sound using extended coerced harmonics" (U.S. Pat. No. 5,466,882). The method disclosed in this patent uses a sinusoidal model to represent the synthesized sound signal. According to the disclosed method, synthesized harmonics are forced into strict harmonic relationship with the fundamental frequency to eliminate phase discontinuities at the loop start and end points. However, forcing the signal to be strictly harmonic is a drastic measure, which can seriously alter the quality of the resulting sound. For example, piano sounds synthesized using this technique can have very poor sound quality.

SUMMARY OF THE INVENTION

In accordance with the present invention, a method and apparatus are provided wherein loop discontinuities in a looped signal are eliminated. In the case of amplitude discontinuities, the harmonic amplitudes contained in the loop are progressively scaled over the length of the loop, so that for each harmonic the loop end amplitude matches the loop beginning amplitude. In the case of phase discontinuities, the harmonic phases are progressively shifted over the length of the loop, so that for each harmonic the loop end phase matches the loop beginning phase. Shifting the phase is accomplished by slightly altering the frequency of the harmonics to produce the desired amount of phase-shift at the loop end. Modification of one or more of the harmonics or frequency components is accomplished independently of the other frequency components. In accordance with the present invention, the method also provides a technique to select loop begin and end points to minimize the amount of phase adjustment.

In an embodiment of the invention a method is provided for looping a signal to form a synthesized signal. The method begins by transforming the signal into a sinusoidal representation comprising at least one frequency component having at least one signal characteristic. The frequency component is adjusted to have a beginning value and an ending value that match thereby forming an adjusted sinusoidal representation. The adjusted sinusoidal representation is then converted to a time domain signal and looped for a plurality of loops to form the synthesized signal.

In another embodiment of the invention, apparatus is provided for forming a loop signal used to create a synthesized signal. The apparatus comprises a memory having a stored signal and a controller coupled to the memory and having logic to access the memory to output the stored signal. A transformer has logic to transform the sinusoidal signal to a sinusoidal representation having a plurality of frequency components. A signal splitter is coupled to the memory and the transformer and has logic to form a residual signal. A harmonic adjuster is coupled to the transformer and has logic to adjust the plurality of harmonic signals to form an adjusted sinusoidal representation. An inverse transformer is coupled to the harmonic adjuster and has logic to inverse transform the adjusted sinusoidal representation to form an adjusted signal. Finally, a combiner is coupled to the signal splitter and the inverse transformer and has logic to combine the residual signal and the adjusted signal to form the loop signal.

DESCRIPTION OF THE SPECIFIC EMBODIMENTS

The present invention provides a method and apparatus for synthesizing sounds from a wavetable using a looping process. The invention is suitable for use in synthesizing sounds having a sinusoidal representation. In sinusoidal representation, the looped signal is represented as the sum of a time-varying number of sinusoidal harmonics, or frequency components, having time-varying frequencies, amplitudes and phases. Because some signals of interest cannot be accurately represented as a sum of sinusoids, a parametric description of the signal includes a residual signal defined as the difference between the original signal and its sinusoidal representation. For example, the noise-like sound of the breath of a person playing a flute cannot be well described by a sinusoidal representation. Therefore, such sounds form part of the residual signal. In general, the residual signal incorporates percussive attacks, such as piano sounds, noisy or random signals, such as in flutes or violins, and everything else that cannot be adequately represented as sinusoids.

Figure 1A:
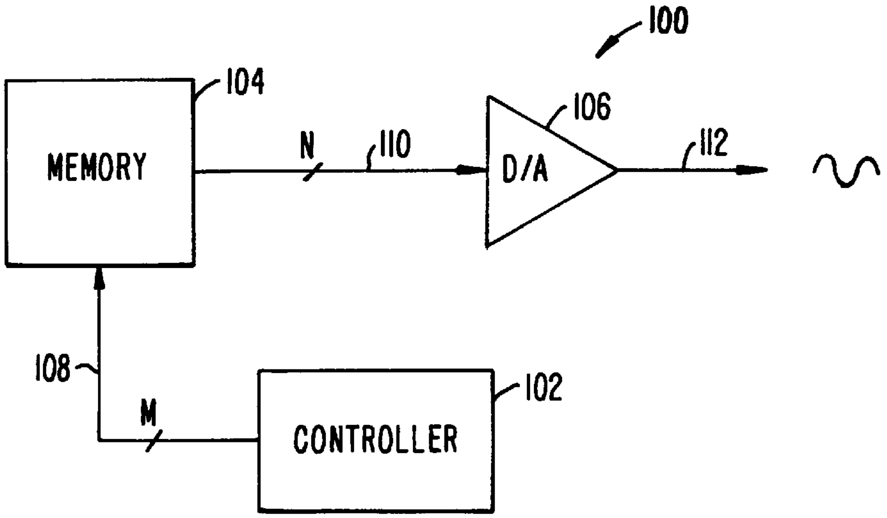
FIG. 1A shows a device 100 for synthesizing a signal.

FIG. 1A shows a block diagram of a device 100 for producing synthesized signals. The device 100 comprises a controller 102, a memory 104 and a digital to analog (D/A) converter 106. The controller 102 is coupled to the memory 104 by address bus 108 which has M address lines. The M address lines can access any of the memory locations contained in the memory 104. In response to an input address, the memory 104 outputs the contents of the corresponding memory location onto data bus 110. The data bus 110 has N data lines where each line transmits one bit of data stored in the respective memory location. For example, if each memory location contains eight data bits, the data bus has eight data lines. The data bus 110 couples the memory to the D/A converter 106. The D/A converter 106 receives the digital information and produces an analog representation of the synthesized signal at output 112. To synthesize a signal, the controller sequences through the memory in any order to produce a stream of digital data at the input of the D/A. The digital data is converted to analog by the D/A, thereby creating the desired synthesized signal at the output 112. By inputting the synthesized signal to an audio device (not shown) an audible synthesized sound can be produced.

Figure 2:
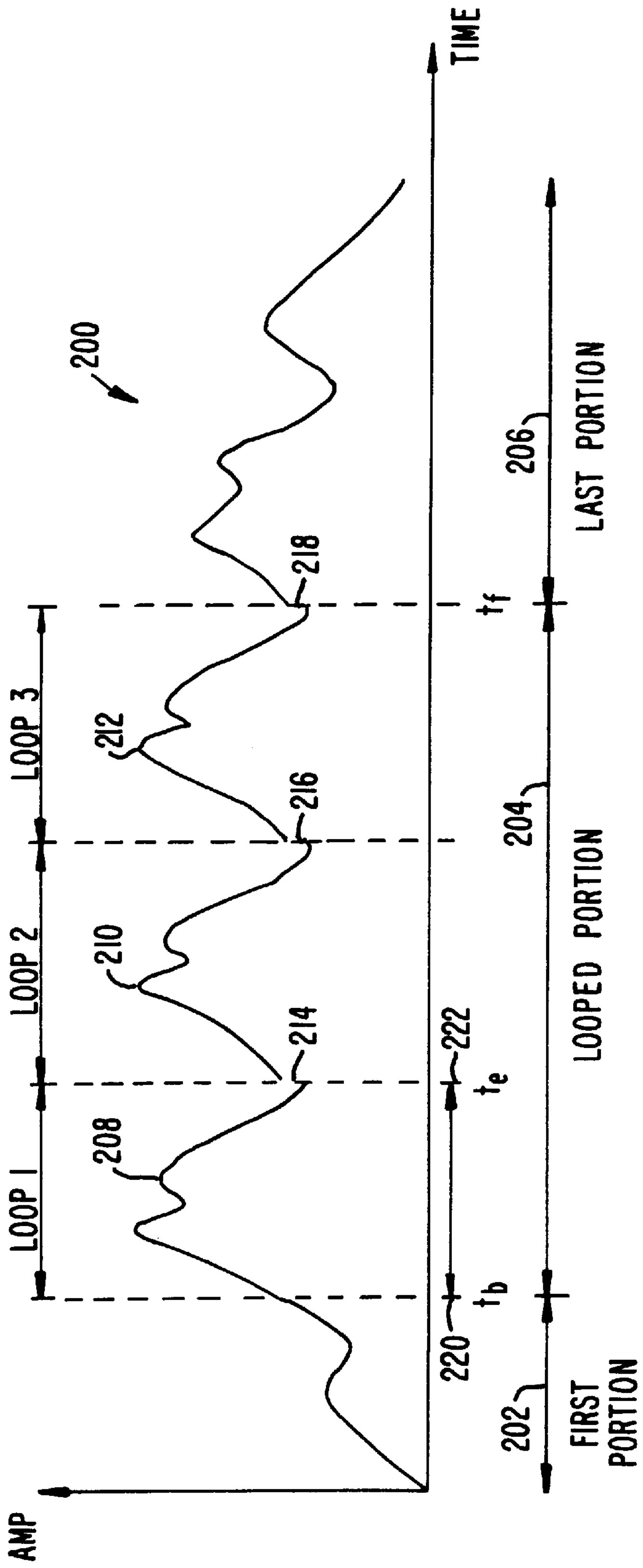
FIG. 2 shows a signal 200 synthesized by device 100.

FIG. 2 shows a signal 200 produced at the output 112 of the device 100. The signal 200 is plotted on a graph where the horizontal axis represents time values and the vertical axis represents amplitude values. The signal 200 comprises a first portion 202, a looped portion 204 and a last portion 206. The looped portion 204 comprises three identical loops shown at 208, 210 and 212 respectively.

Figure 1B:
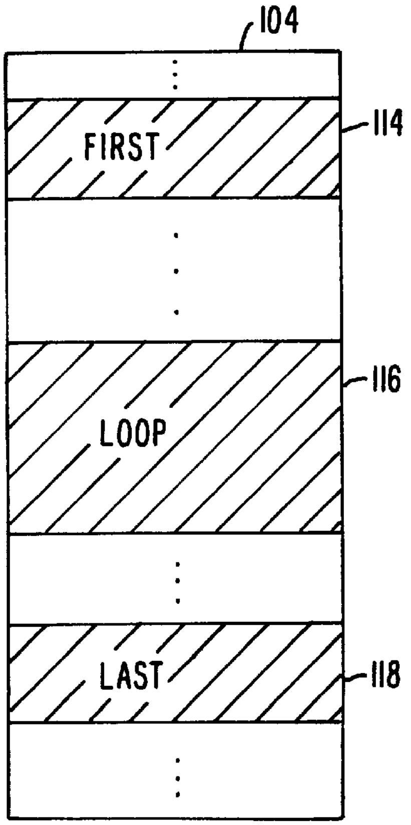
FIG. 1B shows memory 104 used in device 100.

FIG. 1B shows the contents of memory 104 used to produce the signal 200. Stored in the memory 104 are first data 114, loop data 116 and last data 118. The controller 102 addresses each of the data portions 114, 116 and 118 so that their respective contents forms a data stream input to the D/A converter 106. When read from the memory 104, the first data 114 forms first portion 202, the loop data 116 forms loop portion 204 and the last data 118 forms last portion 206. The controller can access the data stored in the memory 104 in any order so that there is no need to store the data in sequential fashion. The controller 102 forms the looped portion 204 by accessing the same loop data 116 three consecutive times to produce the loops 208, 210 and 212 respectively.

Referring again to FIG. 2, loop portion 208 has a begin time $t_b$ 220 and an end time $t_e$ 222. The loop portion 210 begins immediately after end time $t_e$ of loop portion 208. After three consecutive loops, the loop portion 204 is completed at time $t_f$. The last portion 206 begins immediately after time $t_f$. The signal 200 shows discontinuities between consecutive loops at points 214 and 216. The discontinuities exists where the end of one loop does not match the beginning of the next loop. Another discontinuity exists at point 218 where the last loop 212 ends and the last portion 206 begins. As a result of the discontinuities 214, 216 and 218, audible artifacts are produced when outputting the signal 200 from an audio device.

Figure 3:
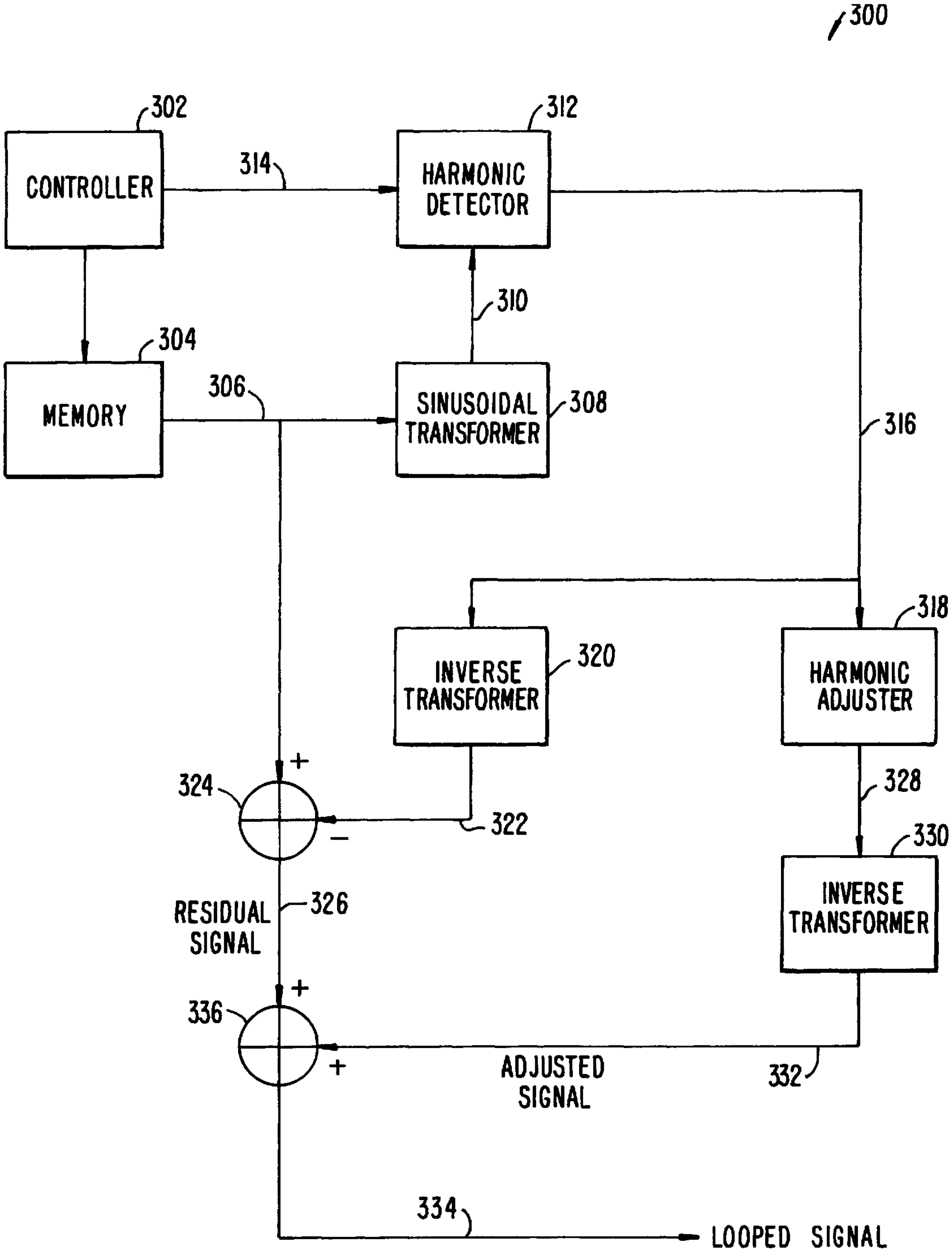
FIG. 3 shows apparatus 300 operable to form a looped signal in accordance with the present invention.

FIG. 3 shows apparatus 300 constructed in accordance with the present invention. Apparatus 300 comprises controller 302 coupled to memory 304. The controller 302 accesses the memory 304 to read out a stored signal 306. For example, the stored signal 306 may be identical to the signal stored in memory 104 used to produce signal 200. The memory couples to sinusoidal transformer 308 that receives the stored signal 306 and produces a sinusoidal transform 310 of the stored signal 306. The sinusoidal transform 310 comprises a fundamental frequency and a related set of harmonic frequencies. Associated with the harmonic frequencies are signal characteristics such as amplitude, phase and frequency characteristics.

A harmonic detector 312 couples to both the controller 302 and the sinusoidal transformer 308. The harmonic detector 312 receives the sinusoidal transform 310 from the transformer 308 and receives instructions 314 from the controller. The instructions 314 direct the harmonic detector 312 to detect characteristics of selected harmonics of the sinusoidal transform 308. For example, the amplitude and phase characteristics of selected harmonics of the sinusoidal transform can be detected. In one embodiment, the controller accesses the memory 304 to read out a signal having a known fundamental frequency. The sinusoidal transform of the signal will comprise harmonics related to the known fundamental frequency. The controller 302 directs the harmonic detector 312 to determine amplitude and phase values of the related harmonics.

The harmonic detector 312 has a harmonic output 316 coupled to harmonic adjuster 318 and inverse transformer 320. The inverse transformer 320 transforms the harmonics detected by the harmonic detector 312 back to a time domain signal 322. The time domain signal 322 can be subtracted from the stored signal 306 by subtracter 324 to from a residual signal 326. The residual signal contains all signal components that are not part of the harmonically detected signal 316.

The harmonic adjuster 318 adjusts the characteristics of the harmonically detected signal in accordance with the present invention to form an adjusted harmonic signal 328. As discussed in a later section, the harmonic adjuster may operate in one of several methods to eliminate the discontinuities in the looped signal as shown as 214, 216 and 218. The harmonic adjuster couples to an inverse transformer 330 which receives the adjusted harmonic signal 328 and transforms it into an adjusted time domain signal 332.

A looped signal 334 is formed at adder 336 by adding the residual signal 326 to the adjusted time domain signal 332. The looped signal 334 is free of discontinuities between the loop begin and end points. Therefore the looped signal 334 may be looped two or more times to form a synthesized signal without producing audible artifacts that occur when loop discontinuities exist.

Figure 4:
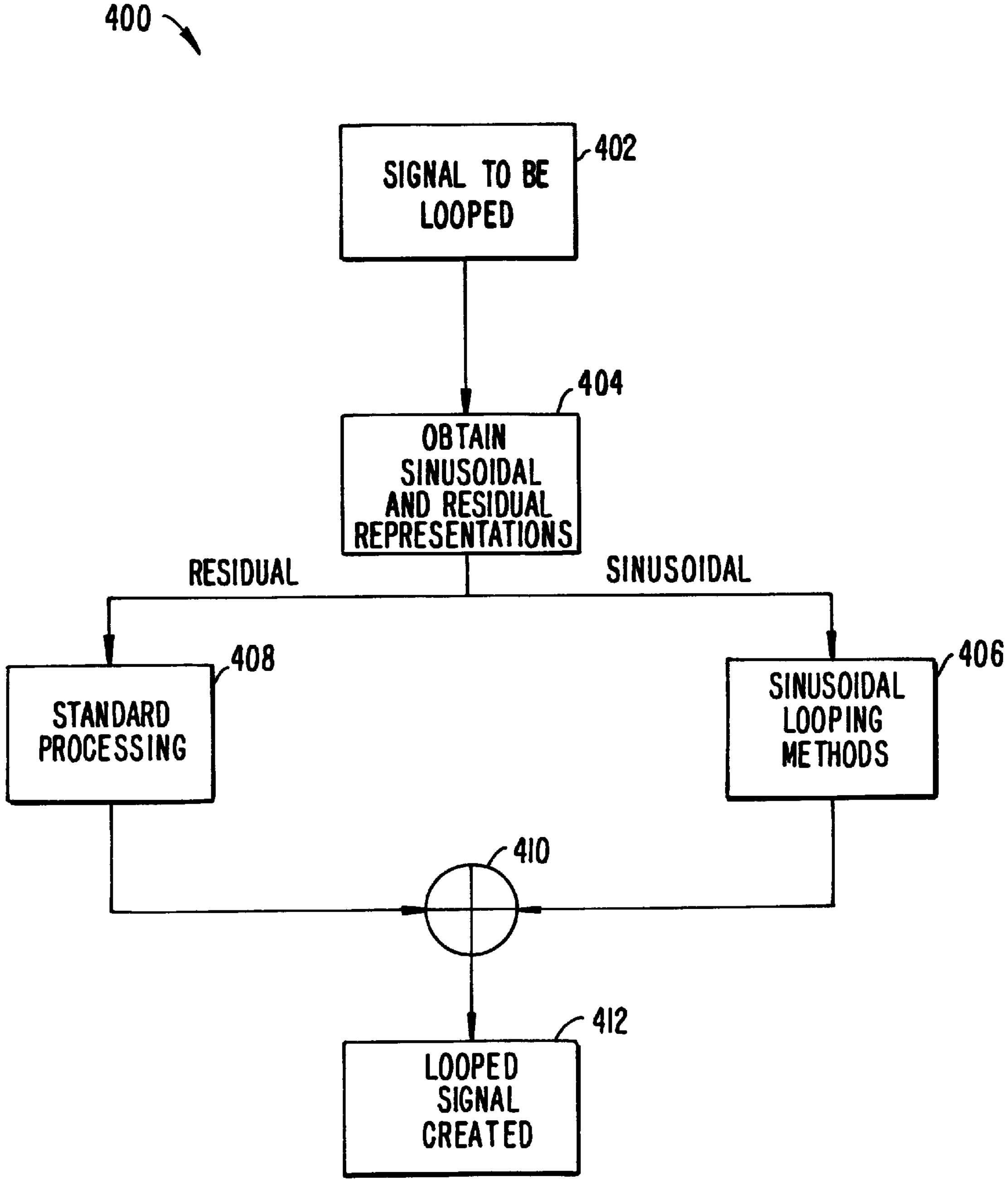
FIG. 4 shows a block diagram of a method 400 for use with the apparatus 300 to form a looped signal in accordance with the present invention.

FIG. 4 shows a block diagram for a method 400 for eliminating the discontinuities of a looped signal in accordance with the present invention. The method 400 begins at block 402 by defining a loop signal portion of a desired synthesized signal. For example, loop portion 208 represents a loop signal portion for signal 200. The loop signal portion may represent some or all of the desired synthesized signal.

At block 404 the loop signal portion is split into a sinusoidal portion and a residual portion. The sinusoidal portion is created by taking the Fourier transform of the loop signal portion. For example, by talking the Discreet Fourier Transform (DFT) of the loop signal portion the resulting sinusoidal representation comprises a sum of a time-varying number of sinusoidal harmonics, wherein each of the sinusoidal harmonics have time-varying amplitudes and phases. The residual portion contains all other signal components of the loop signal portion, such as noise components and non-sinusoidal components.

At block 406, the sinusoidal portion undergoes processing in accordance with the present invention to form a looped sinusoidal signal. At block 408, the residual portion goes unprocessed or undergoes standard processing techniques. At combiner 410 the looped sinusoidal signal and the residual signals are combined to form the looped signal at block 412. The looped signal at block 412 will be free from the discontinuities that result between consecutive loops or at the end of the last loop and the last portion of the synthesized signal. As a result, no audible artifacts are detectable when outputting a synthesized signal formed from the looped signal from an audio device.

Figure 5:
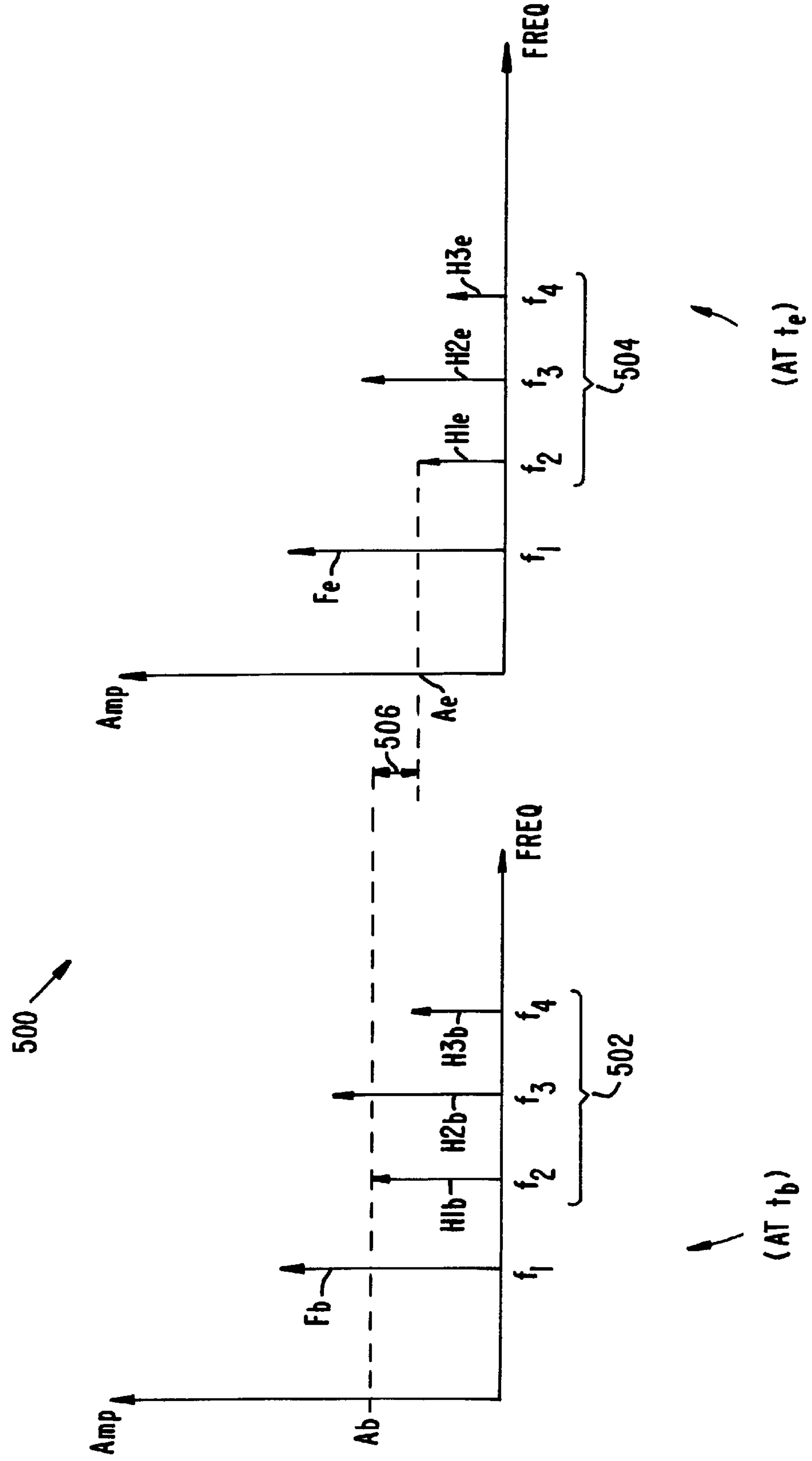
FIG. 5 shows a frequency representation 500 of the signal 200.

FIG. 5 shows a sinusoidal or frequency representation 500 of the loop signal portion 208 at the begin time $t_b$ 220 and end time $t_e$ 222. The frequency representation 500 results from taking the Fourier transform of the looped signal portion 208. The frequency representation 500 comprises a fundamental frequency $F_b$ and has a first set of harmonics 502 which represent harmonics $H1_b$–$H3_b$ associated with the loop portion 208 at time $t_b$. For convenience, only three harmonic signals are shown, however, the number of harmonic signals may be more or less depending on the complexity of the looped signal. The harmonics are plotted on a graph where the horizontal axis represents frequency and the vertical axis represents amplitude. Also part of the frequency representation 500 is a second set of frequency components comprising a fundamental $F_e$ and harmonics 504 which represent harmonics $H1_e$–$H3_e$ associated with the loop portion 208 at time $t_e$. Discontinuities that exist between the end of one loop and the beginning of the next loop, such as at 214, can be seen as amplitude differences between the beginning and ending harmonic representations of the looped signal. For example, the first harmonic H1, has an amplitude difference 506 between $H1_b$ and $H1_e$ which is representative of an undesirable loop discontinuity.

Figure 6:
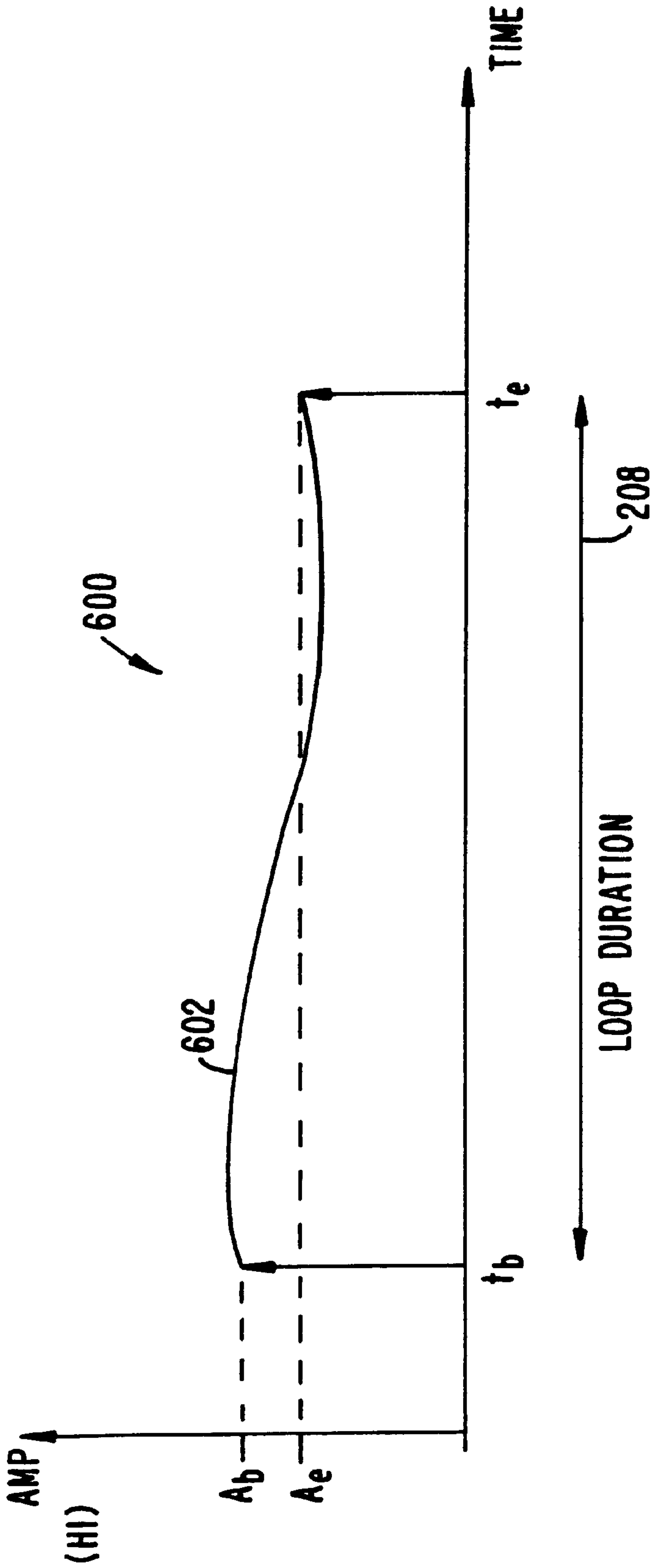
FIG. 6 shows waveform 600 representative of the harmonic H1 of the signal 200.

FIG. 6 shows a plot 600 of a waveform 602 representative of the amplitude of harmonic H1 over the loop duration 208. At time $t_b$ the waveform 602 is equivalent to harmonic $H1_b$ of FIG. 5 and has an amplitude of $A_b$. At time $t_e$ the waveform 602 is equivalent to harmonic $H1_e$ or FIG. 5 and has an amplitude of $A_e$. In between $t_b$ and $t_e$ the waveform 602 represents amplitude changes to harmonic H1 during the loop duration 208.

Figure 7:
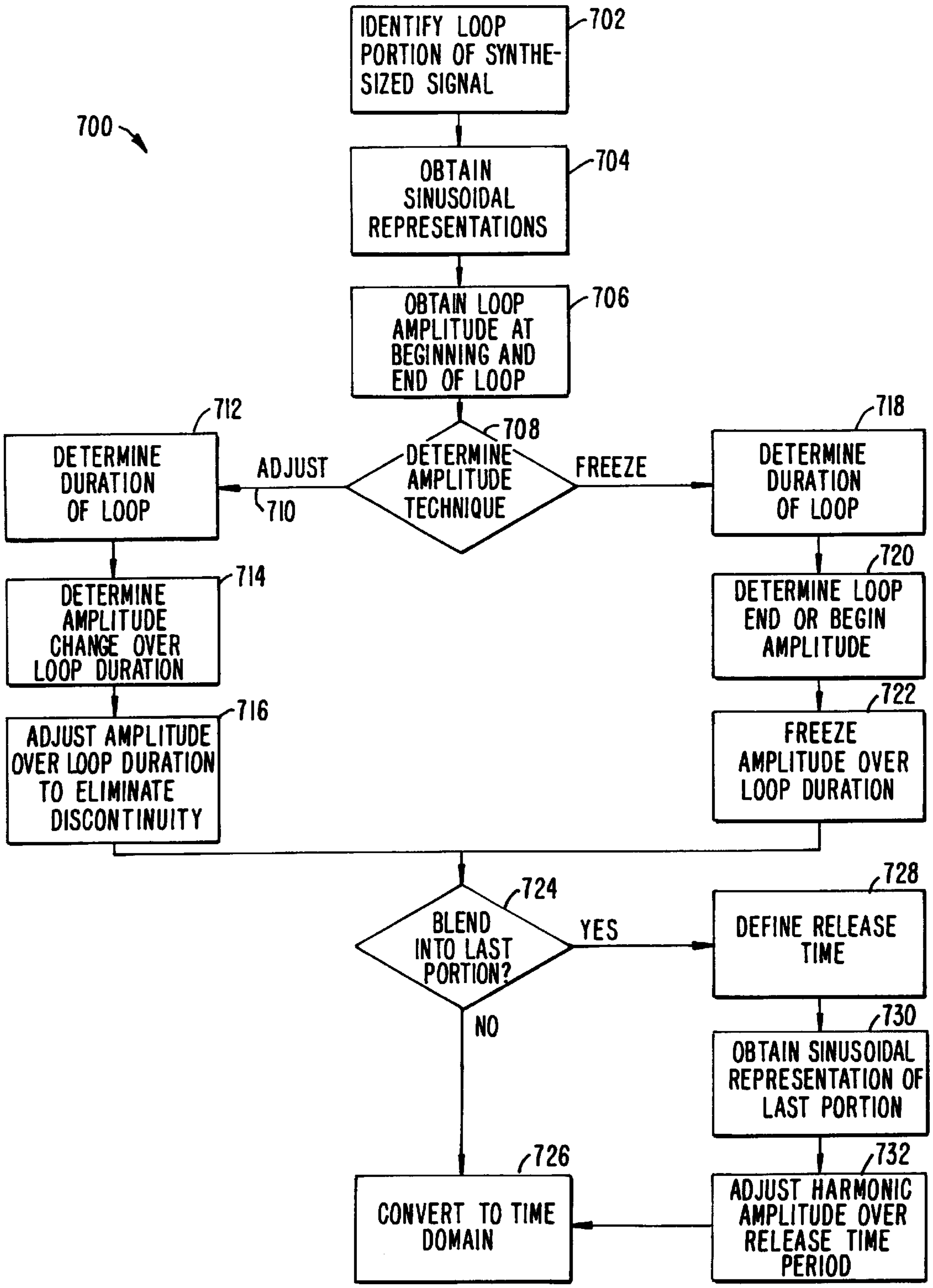
FIG. 7 show a method 700 for adjusting the harmonic amplitudes of a loop signal in accordance with the present invention.

FIG. 7 show a method 700 for adjusting the harmonic amplitudes of a signal suitable for use at block 406 of method 400 in accordance with the present invention. By adjusting the harmonic amplitudes, discontinuities in the looped signal are reduced or eliminated.

At block 702, a loop portion of a desired synthesized signal is identified. For example, in the synthesized signal 200, the loop portion 208 would be identified for processing by the method 700. In other signals, the loop portion may be the entire signal and not limited to a portion of the signal.

At block 704, sinusoidal representations of the identified loop portion are obtained. The sinusoidal representations are determined by taking the Fourier transform at the begin loop time $t_b$ and the end loop time $t_e$. At block 706, the amplitudes for harmonics in the sinusoidal representations are compared to detect amplitude changes between the corresponding harmonics at the beginning and end of the loop. Any differences in the amplitudes of the harmonics are representative of loop discontinuities.

At block 708, a decision is made between one of two techniques for adjusting the amplitudes of the loop harmonics to eliminate discontinuities. The two techniques are discussed herein with further reference to one or more figures.

Following path 710, a first adjustment technique modifies the amplitudes of the harmonics H1–H3 so that the respective amplitude values are the same at the beginning and ending loop points.

At block 712, the loop duration 208 is determined from the expression $(t_e - t_b)$. At block 714 the amplitude change over the loop duration 206 is determined from the expression $(A_b - A_e)$.

At block 716 a modified amplitude for each loop harmonic is computed. Denoting $A(i, t_b)$ and $A(i, t_e)$ as the original amplitudes of harmonic i at the beginning ($t_b$) and ending ($t_e$) loop points, respectively, a modified harmonic amplitude A'(i, t) is defined by the expression:

$$A'(i,t) = A(i,t) + (A(i,t_b) - A(i,t_e))\frac{t - t_b}{t_e - t_b} \quad \forall \quad t_b \le t \le t_e$$

where: A (i, t) is the unmodified amplitude of the harmonic i at time t;

A'(i, t) is the modified amplitude of the harmonic i at time t;

$t_b$ is the beginning time of the loop; and $t_e$ is the ending time of the loop.

For example, the amplitude of harmonic $H1_b$ is denoted as $A(1, t_b)$ and the amplitude for harmonic $H1_e$ is denoted $A(1,t_e)$. The modified amplitude A'(i, t) assures that:

$$A'(i,t_e)=A'(i,t_b)=A(i,t_b)$$

thus eliminating amplitude discontinuities at the loop end point. It will be apparent to those of skill in the art that a similar modification can be made to achieve similar results by modifying the harmonics in a reverse fashion so that:

$$A'(i,t_e)=A'(i,t_b)=A(i,t_e)$$

Figure 8A:
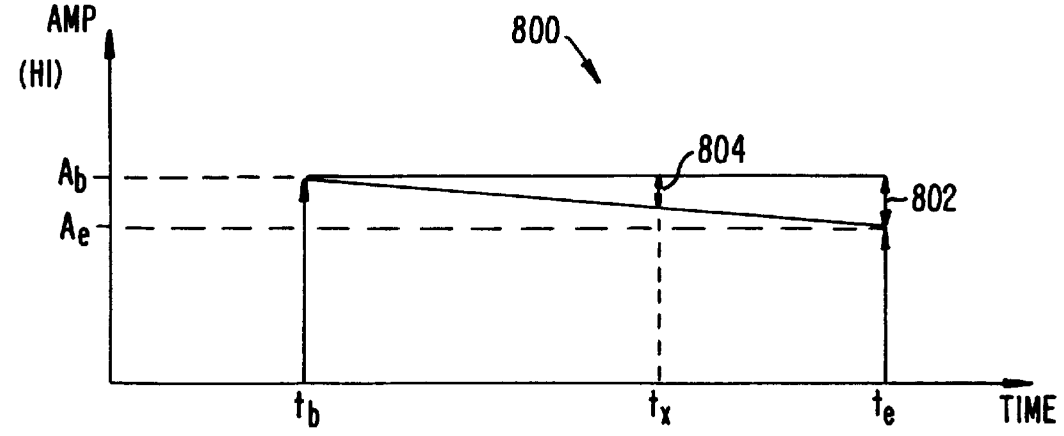
FIG. 8A shows a graphical representation 800 of the process of creating modified harmonic amplitudes A'(i, t) in accordance with method 700.

FIG. 8A shows a graphical representation 800 of the process of creating the modified harmonic amplitudes A'(i, t) as determined by the above expressions. The change in the harmonic amplitude from the loop beginning $t_b$ to the loop end $t_e$ is shown at 802. For each time value within the loop duration, a small amplitude adjustment is made so that by the end of the loop duration, the harmonic amplitudes at the beginning and end of the loop match. For example, at time $t_x$ the amplitude of the harmonic is adjusted by an amount shown at 804. The process is performed for all the harmonics of the sinusoidal representation.

Figure 8B:
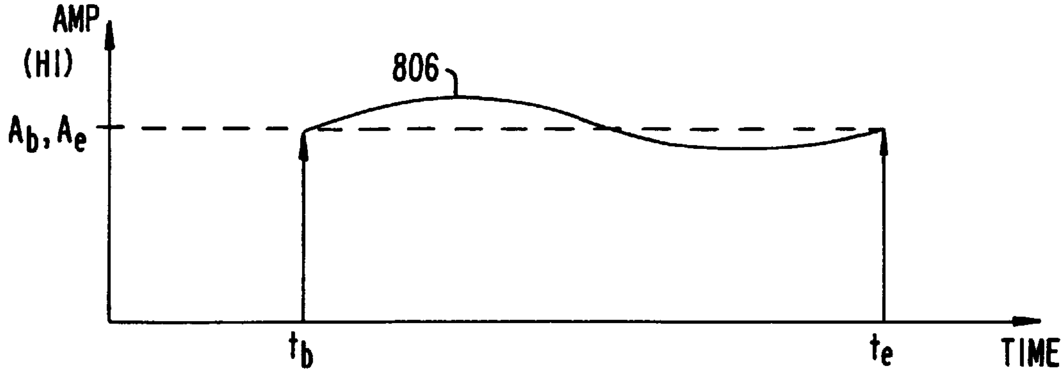
FIG. 8B shows the harmonic H1 of the signal 200 after adjustment in accordance with method 700.

FIG. 8B shows the harmonic H1 after the amplitude adjustment described above. The original harmonic H1 is shown as waveform 602 in FIG. 6. The waveform 806 shows the amplitude of the harmonic H1 adjusted over the loop duration. The adjustment results in distributing the amplitude differential throughout the loop duration and eliminating amplitude discontinuities at the loop begin and end points. However, because the harmonic amplitude continues to evolve during the loop, the resulting adjusted harmonic H1 may exhibit a timbral modulation corresponding to the loop rate.

Referring again to FIG. 7, to avoid the possibility of timbral modulation, another type of modification consists of "freezing" the harmonic amplitude during the loop to the amplitude level found at the loop beginning. At block 718 the loop duration is determined as in block 712. At block 720, the harmonic amplitudes are determined at the beginning and end of the loop.

At block 722, the modified harmonic amplitudes A'(i, t) are derived using the freezing method defined by the expression:

$$A'(i,t)=A(i,t_b)\ \forall t_b \leq t \leq t_e$$

The freezing method keeps the harmonic amplitudes constant during the loop thereby avoiding the amplitude related timbral modulation. It will be apparent to one with skill in the art that a similar modification can be made to achieve similar results by modifying the harmonics in a reverse fashion so that:

$$A'(i,t)=A(i,t_e)\ \forall t_b \leq t \leq t_e$$

Figure 8C:
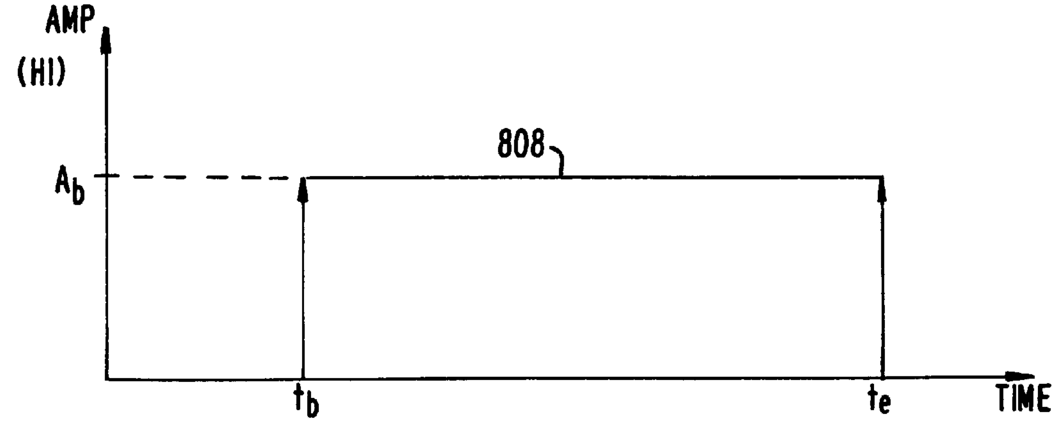
FIG. 8C shows the result of the "freezing" technique in accordance with method 700.

FIG. 8C shows the result of the "freezing" technique wherein the adjusted harmonic amplitude 808 has been frozen, or set, to the harmonic amplitude of the beginning of the loop. For example, for the harmonic H1, the amplitude of the harmonic is set to the value of $H1_b$ for the duration of the loop.

Referring again to FIG. 7, at block 724, after performing one of the above techniques for adjusting the harmonic amplitudes, a determination is made whether a discontinuity exists at the boundary between the end of the adjusted loop and the last portion of the synthesized signal. If no discontinuity exists or there is no last portion, the method proceeds to block 726. If a discontinuity exists, the method proceeds to block 728.

Block 726 is used if it is determined at block 724 that either there is no last portion or no discontinuity exists between the looped portion and the last portion. The sinusoidal representation of the signal, having the adjusted harmonic amplitudes, is converted back to the time domain representation. After the conversion to the time domain, the method is completed so that the adjusted looped portion can be looped a number of time to form the synthesized signal, wherein no discontinuities exist and no audible artifacts are detectable.

Block 728 is used if it is determined at block 724 that a discontinuity exists between the looped portion and the last portion. For example, a discontinuity at the loop end is shown at 218. Block 728 begins a process where the last loop of the looped portion is blended into the last portion. To accomplish this, a release time $t_r$ defines a time release period that will be used to blend the last loop with the last portion.

At block 730 a sinusoidal representation of the last portion is formed by taking the Fourier transform of the time domain representation of the last portion over the release time period.

At block 732, blending occurs by forming a modified amplitude harmonic A'(i, t) defined during the release period and given by the expression:

$$A'(i,t)=A'(i,t_e)+\left[\frac{t-t_e}{t_r-t_e}\right]A(i,t)\ \forall\ t_e \leq t \leq t_r$$

and outside the release period given by the expression;

$$A'(i,t)=A(i,t)\ \forall t>t_r$$

Figure 9:
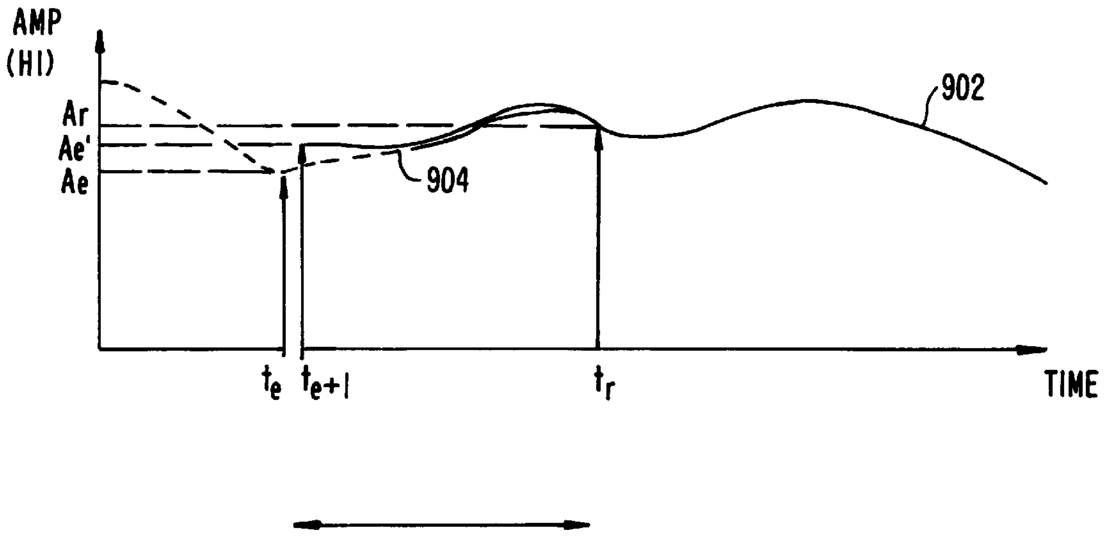
FIG. 9 shows the harmonic H1 of the signal 200 adjusted during the release period in accordance with the present invention.

FIG. 9 shows the amplitude of the H1 harmonic as a the result of the blending process of block 632. Waveform 902 shows the last portion of the synthesized signal. The loop portion ends at time $t_e$ and the last portion begins at time $(t_e+1)$. The waveform 904 shows the modified H1 harmonic as a result of the blending process. The modified waveform 904 adjusts the amplitude of the H1 harmonic from $t_e+1$ through $t_r$. As a result, any amplitude discontinuity at the boundary between the looped portion and the last portion is eliminated.

Referring again to FIG. 7, at the completion of the blending process, the method flows to block 726 where the adjusted signal, comprising the adjusted loop portion and the adjusted last portion, is converted back to the time domain representation. The final synthesized signal is formed by concatenating the adjusted last portion to the looped portion to form the desired synthesized signal which will be free of amplitude discontinuities.

In another embodiment of the present invention, discontinuities at loop end points due to phase differences can be eliminated. Loop discontinuities, such as discontinuities shown at 214 and 216 can be associated with phase differences in the sinusoidal harmonics. In a method similar to method 700, the phase of each harmonic can be modified so that its value is the same at the beginning and end loop points. This embodiment may be done in conjunction with, or instead of, the prior embodiment that adjusts the harmonic amplitudes.

Figure 10A:
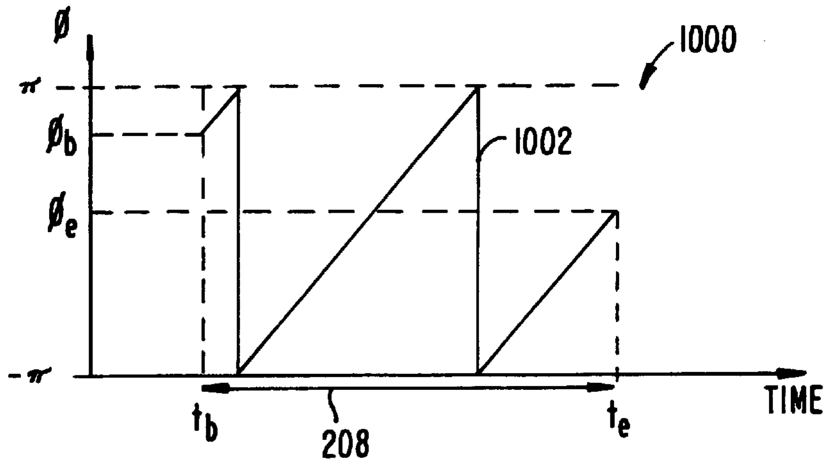
FIG. 10A shows a phase of the harmonic H1 of the signal 200 graphed over the loop duration.

FIG. 10A shows a plot 1000 of a phase waveform 1002 representative of a phase angle (ϕ1) for the H1 harmonic over the loop duration 208. At time $t_b$ the phase waveform 1002 is equivalent to the phase of harmonic $H1_b$ of FIG. 4 and has a phase value of $\phi_b$. At time $t_e$ the phase waveform 1002 is equivalent to the phase of harmonic $H1_e$ of FIG. 4 and has a phase value of $\phi_e$. In between $t_b$ and $t_e$ the phase waveform 1002 represents phase changes to harmonic H1 during the loop duration 208.

Figure 11:
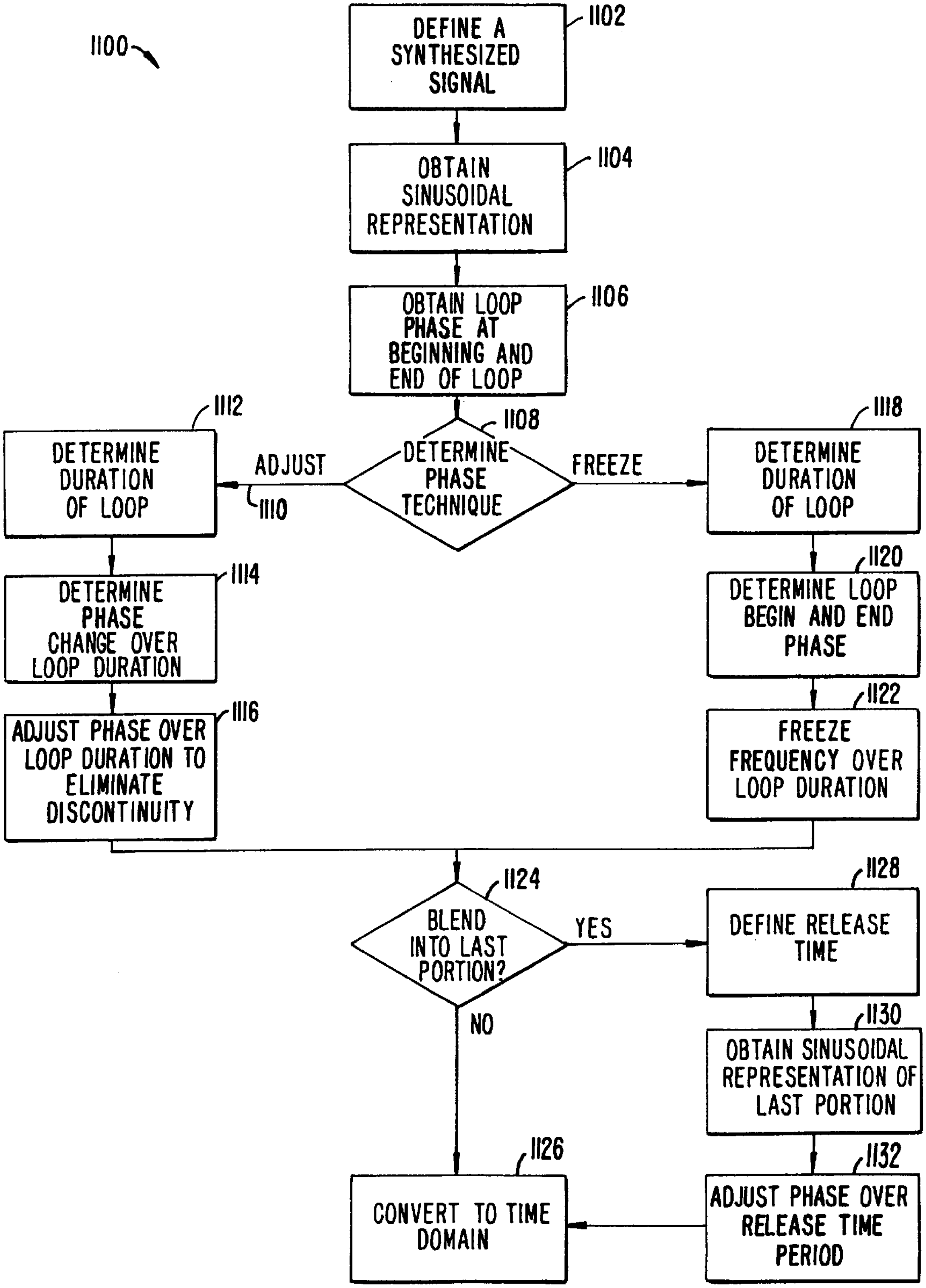
FIG. 11 shows a method 1100 for adjusting the phase of a looped signal in accordance with the present invention.

FIG. 11 show a method 1100 for adjusting the phase of a signal for use at block 406 of method 400 in accordance with the present invention. By adjusting the phase, discontinuities in the looped signal are reduced or eliminated.

At block 1102, a loop portion of a desired synthesized signal is identified. For example, in the synthesized signal 200, the loop portion 208 would be identified for processing by the method 1100. In other signals, the loop portion may be the entire signal.

At block 1104, sinusoidal representations of the identified loop portion are obtained. The sinusoidal representations are determined at the begin loop time $t_b$ and the end loop time $t_e$. At block 1106, the phase for corresponding harmonics in the sinusoidal representations are compared to detect phase changes between the beginning and end of the loop. Any differences in the phase of the harmonics are representative of loop discontinuities.

At block 1108, a decision is made between one of two techniques for adjusting the phases of the loop harmonics to eliminate discontinuities. The two techniques are discussed herein with further reference to one or more figures.

Following path 1110, a first technique avoids phase discontinuities at the loop end points by modifying the phases of the harmonics so that the respective phase values are the same at the beginning and ending loop points.

At block 1112, the loop duration 208 is determined from the expression $(t_e - t_b)$. At block 1114 the phase change over the loop duration 208 is determined from the expression $(\phi_b - \phi_e)$.

At block 1116 a modified phase for each of the harmonics is computed. Denoting $\phi(i.t_b)$ and $\phi(i,t_e)$ to be the phases of harmonic i at the begin loop time $t_b$ and end loop time $t_e$, respectively, a phase shift $\Delta\phi(i)$ is calculated between the beginning and end phases according to the following expression:

$$\Delta\phi(i)=\phi(i,t_b)-\phi(i,t_e)$$

The phase shift is then distributed across the entire loop duration according to the expression:

$$\phi'(i,t)=\phi(i,t)+\left[\frac{t-t_b}{t_e-t_b}\right]\Delta\phi(i)\ \forall\ t_b\le t\le t_e$$

Because the phases are known only between $-\pi$ and $+\pi$, $\Delta\phi(i)$ is expressed between $-\pi$ and $+\pi$ by adding or subtracting $2\pi$ to the phase value $[\phi(i,t_b)-\phi(i,t_e)]$ until the result lies in the desired range. This guarantees that the amount of phase shift will be as small as possible.

Figure 10B:
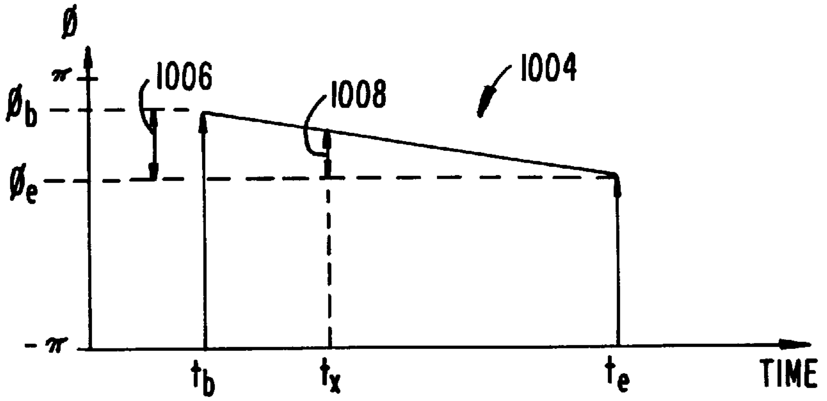
FIG. 10B shows a phase differential over the loop duration.

FIG. 10B shows a graphical representation 1004 of the process of creating the modified harmonic phases $\phi'(i, t)$ as determined by the above expressions. The change in the harmonic phase from the loop beginning $t_b$ to the loop end $t_e$ is shown at 1006. For each time value within the loop duration, a small phase adjustment is made so that by the end of the loop duration, the harmonic phases at the beginning and end of the loop match. For example, at time $t_x$ the phase of the harmonic is adjusted by an amount shown at 1008. The process is performed for all the harmonics of the sinusoidal representation.

Figure 10C:
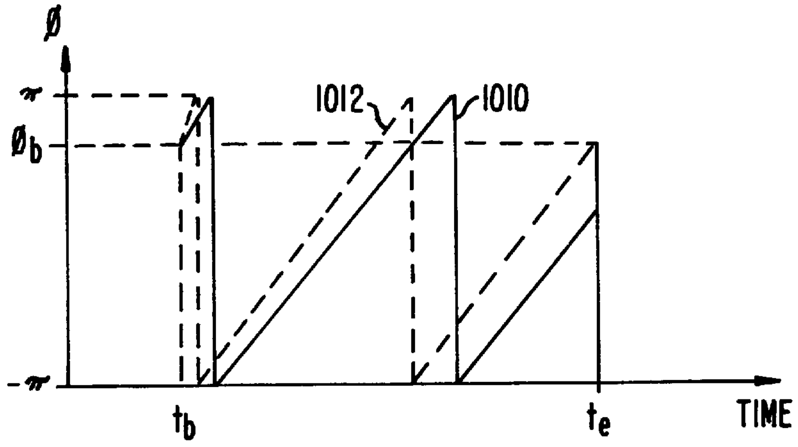
FIG. 10C shows the first harmonic H1 of the signal 200 after a phase adjustment in accordance with a method of the present invention.

FIG. 10C shows the harmonic H1 after the phase adjustment described above. The original phase of harmonic H1 is shown as waveform 1010. The waveform 1012 shows the phase of the harmonic H1 adjusted over the loop duration, so that the beginning and end phase values match. The adjustment results in distributing the phase differential throughout the loop duration. However, because the harmonic phase continues to evolve during the loop, the resulting adjusted harmonic H1 may exhibit a perceptual modulation corresponding to the loop rate.

Referring again to FIG. 11, to avoid the possibility of perceptual modulation, another type of phase modification may be performed wherein the harmonic phase is adjusting and then the harmonic frequency is frozen over the duration of the loop, thus making sure that the harmonic phase at the beginning and the ending of the loop match. At block 1118, the loop duration is determined as in block 612. At block 1120, the harmonic phases are determined at the beginning and end of the loop.

At block 1122, another type of phase modification is performed. This modification consists of adjusting and then freezing the harmonic frequency over the duration of the loop. To do this, the average frequency of each harmonic is calculated over the loop duration. A frequency shift $\Delta\omega(i)$ is computed and added to the average frequency to obtain the freeze frequency. The frequency shift is given by the expression:

$$\Delta\omega(i)=\Delta\phi(i)/(t_e-t_b)$$

The harmonic frequency is then set to the resulting freeze frequency for the duration of the loop. This guarantees that a harmonic having the above computed freeze frequency will have its phase match exactly at the beginning and end loop points. As a result, the periodic frequency modulation is removed and the quality of the looped sound remains intact.

Figure 10D:
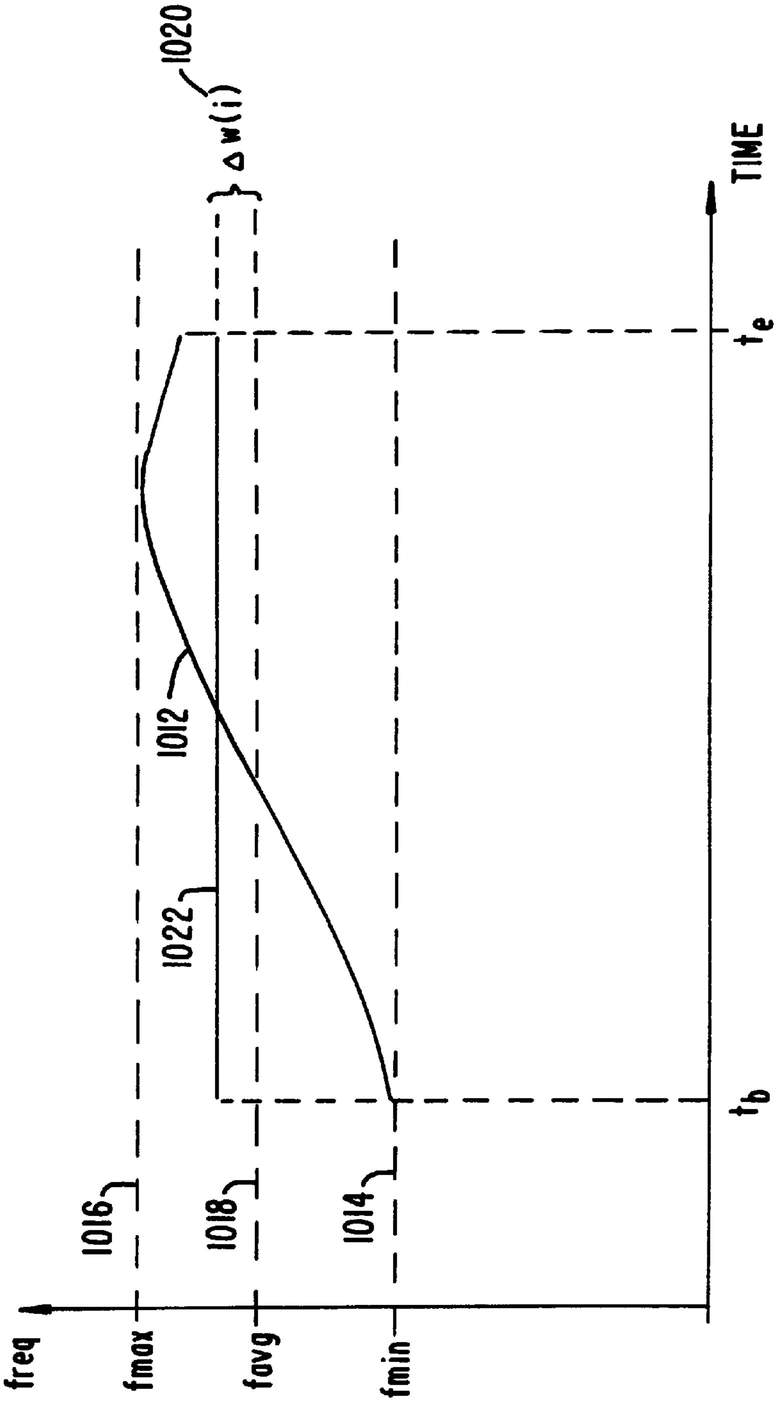
FIG. 10D shows the first harmonic H1 as a result of the freezing technique.

FIG. 10D shows waveforms which illustrate the frequency freezing technique. Frequency waveform 1012 shows the frequency variation of a selected harmonic over the duration of the loop. Frequency waveform 1012 varies from a frequency minimum 1014 to a frequency maximum 1016. From the frequency waveform 1012, an average frequency 1018 can be determined. The associated frequency shift $[\Delta\omega(i)]$ 1020 is computed from the above equation. A freeze frequency 1022 is determined by adding the frequency shift 1020 to the average frequency 1018. To eliminate any phase discontinuities, the harmonic frequency is set to the value of the freeze frequency for the duration of the loop.

Referring again to FIG. 11, at block 1124, after performing one of the above techniques for adjusting the harmonic phases, a determination is made whether a discontinuity exists at the boundary between the end of the adjusted loop and the last portion of the synthesized signal. If no discontinuity exists or there is no last portion, the method proceeds to block 1126. If a discontinuity exists, the method proceeds to block 1128.

Block 1126 is used if it is determined at block 1124 that there is no last portion or there is no discontinuity between the looped portion and the last portion. The sinusoidal representation of the signal, having the adjusted harmonic phases, is converted back to the time domain representation. After the conversion to the time domain, the phase adjusted looped portion can be looped a number of time to form the synthesized signal, wherein no discontinuities exist and no audible artifacts are detectable.

Block 1128 is used if it is determined at block 1124 that a discontinuity exists between the end of the looped portion and the last portion. For example, a discontinuity at the loop end is shown at 218. Block 1128 begins a process where the looped portion is blended into the last portion. To accomplish this, a release time $t_r$ defines a release time period that will be used to blend the phase of the looped portion with the last portion.

At block 1130 a sinusoidal representation of the last portion is formed by taking the Fourier transform of the time domain representation of the last portion over the release time period $t_r$.

At block 1132, blending occurs by forming phase modified harmonics φ'(i, t) defined during the release period and given by the expression:

$$\phi'(i,t)=\phi(i,t)-\left[\frac{t_r-t}{t_r-t_e}\right]\Delta\phi(i)\ \ \forall\ \ t_e\le t\le t_r$$

and after the release time period the phase is simply the unmodified phase of the last portions expressed as:

$$\phi'(i,t)=\phi(i,t)\ \forall t>t_r$$

As a result of the above processing, the harmonic phases are proportionally blended over the release period of the last portion in a fashion similar to the blending of the harmonic amplitudes.

Referring again to FIG. 11, at the completion of the blending process, the method flows to block 1126 where the adjusted signal is converted back to the time domain representation. The final synthesized signal is formed by concatenating the looped portion with the adjusted last portion to form the desired synthesized signal.

As a result of the above phase modifications, phase discontinuities are eliminated, however, artifacts may be introduced due to the changes in harmonic frequencies. For example, progressively adding the phase shift Δφ(i) corresponds to increasing the sinusoidal frequency by a frequency shift Δω(i) as expressed by the equation:

$$\Delta\omega(i)=\frac{\Delta\phi(i)}{t_e-t_b}$$

It is possible that frequency shifts may be perceivable to a listener depending on the value of the phase shift, the duration of the loop and the frequency of the sinusoid. For example, if frequency shifts as low as 0.3% will be audible to a listener, then there should be at least 166 periods of any given harmonic in the loop so that the frequency shift will be inaudible. Since the phase shift over the duration of the loop is never larger than a ½ period, the length of the loop in periods may be determined by 0.5/0.003 which results in approximately 166 periods. It will be apparent to one skilled in the art that by changing the frequency shift threshold of audibility from 0.3% to another value, more or less periods of the harmonic may be required in the loop to prevent audible artifacts. The most desirable situation is where the frequency shift is minimized so that the chance of a listener detecting it is remote.

The loop duration of 166 harmonic periods means that low frequency harmonics, having long periods, might require larger loop times. For example, a 1000 Hz harmonic requires a loop time of 166 milliseconds while a 100 Hz harmonic might require the loop to be 1.6 seconds. Thus, it is important to minimize the phase shifts for low frequency harmonics to avoid audible frequency shifts.

One method of minimizing the phase shift for low frequency harmonics is to optimize the loop points around tentative beginning $t_b'$ and ending $t_e'$ times. For example, if the actual loop begin time $t_b$ is to lie in the range $t_b-<t_b<t_b+$ and the actual loop end time is to lie in the range $t_e-<t_e<t_e+$, it is possible to test all pairings of tentative begin and end points, $t_b'$ and $t_e'$ by calculating the phase shifts and the relative frequency shifts that apply to each harmonic if a loop were to be formed around these tentative begin and end points. This calculation can be expressed by:

$$\frac{\Delta\omega(i)}{\omega(i)}=\frac{1}{\omega(i)}\left[\frac{\phi(i,t_b')-\phi(i,t_e')}{t_e-t_b}\right]$$

As a result, a composite quality measurement to summarize the quality of the tentative pairing of loop points could be expressed as:

$$E=\frac{1}{\sum_{i=1}^{I}W_i}\left[\sum_{i=1}^{I}\frac{(\Delta\omega(i))^2}{(\omega(i))^2}W_i\right]$$

where $W_i$ is a positive harmonic weighting function that may be a constant, or may depend on the harmonic amplitudes. At the completion of this test, the optimized loop begin and loop end points are the pair from which the composite measurement E is minimized.

Therefore, the present invention provides methods for adjusting a looped signal to eliminate amplitude and phase discontinuities between loops and between the loop end and the last portion of the synthesized signal. The methods also provide criteria for optimizing the loop points to prevent noticeable artifacts forming from the loop adjustments. It will be apparent to those with skill in the art that the above methods and embodiments can be rearranged, reordered or combined in any fashion without deviating from the scope of the present invention. For example, both amplitude and phase adjustments can be made at block 406 of method 400 to eliminate discontinuities in the looped signal.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set forth in the following claims.

What is claimed is:

1. A method for looping a signal to form a synthesized signal comprising:

transforming the signal into a sinusoidal representation comprising a plurality of frequency components, wherein each of the frequency components has a signal characteristic having a beginning value and an ending value; and adjusting the signal characteristic of at least one frequency component so that the beginning value and the ending value match, wherein an adjusted sinusoidal representation is formed.

2. The method of claim 1 further comprising a step of converting the adjusted sinusoidal representation to a loop signal that may be looped for a plurality of loops to form the synthesized signal.

3. The method of claim 1 wherein the step of adjusting comprises steps of:

selecting a loop start and a loop end for the sinusoidal representation so that the difference between the signal characteristic of the at least one frequency component at the loop start and the loop end is limited to a threshold value;

defining the sinusoidal representation to begin at the loop start and end at the loop end; and adjusting the signal characteristic of the at least one frequency component so that the beginning value and the ending value match, wherein the adjusted sinusoidal representation is formed.

4. The method of claim 1 wherein the signal further comprises a last signal portion and the method further comprises steps of:

defining a release time period within the last signal portion, wherein the release time period has a begin release time and an end release time;

transforming the last portion to a last sinusoidal representation comprising the at least one frequency component having the signal characteristic;

adjusting the signal characteristic of the at least one frequency component of the last sinusoidal representation, wherein the value of the signal characteristic at the begin release time matches the ending value to form an adjusted last portion.

5. The method of claim 4, further comprising steps of:

converting the adjusted last portion to a time domain last portion; and concatenating the time domain last portion to the end of the plurality of loops to form the synthesized signal.

6. Apparatus for forming a loop signal used to create a synthesized signal comprising:

a loop processor having logic to output a sinusoidal signal to be looped;

a harmonic processor coupled to the loop processor and having logic to receive the sinusoidal signal, wherein the harmonic processor includes a harmonic detector having logic to detect harmonics in the sinusoidal signal and a harmonic adjuster having logic to adjust the detected harmonics to form adjusted harmonics; and a transformer coupled to the loop processor and the harmonic processor and having logic to transform and combine the detected harmonics and the adjusted harmonics to form the loop signal.

7. The apparatus of claim 6 wherein the loop processor comprises:

a memory for storing a first representation of the loop signal;

a processor coupled to the memory and having logic to store and retrieve the first representation of the loop signal; and a sinusoidal transformer coupled to the memory and having logic to receive and transform the first representation of the loop signal to a sinusoidal signal.

8. The apparatus of claim 6 wherein the transformer comprises:

a first inverse transformer having logic to receive the detected harmonics and the first representation and having logic to produce a residual signal; and a second inverse transformer having logic to receive the adjusted harmonics and the residual signal to having logic to produce the loop signal.

9. The apparatus of claim 6 wherein the harmonic processor comprises logic to adjust the amplitude of at least one of the detected harmonics, to form the adjusted sinusoidal representation.

10. The apparatus of claim 6 wherein the harmonic processor is coupled to the transformer and comprises logic to adjust the phase of at least one of the detected harmonics, to form the adjusted sinusoidal representation.

* * * * *